US011264337B2

(12) United States Patent
Chang et al.

(10) Patent No.: US 11,264,337 B2
(45) Date of Patent: Mar. 1, 2022

(54) SEMICONDUCTOR PACKAGE STRUCTURE

(71) Applicant: MEDIATEK INC., Hsinchu (TW)

(72) Inventors: Chia-Cheng Chang, Hsinchu (TW);
 Tzu-Hung Lin, Hsinchu (TW);
 I-Hsuan Peng, Hsinchu (TW); Yi-Jou Lin, Hsinchu (TW)

(73) Assignee: MEDIATEK INC., Hsinchu (TW)

(*) Notice: Subject to any disclaimer, the term of this patent is extended or adjusted under 35 U.S.C. 154(b) by 0 days.

(21) Appl. No.: 16/702,104

(22) Filed: Dec. 3, 2019

(65) Prior Publication Data

US 2020/0105684 A1  Apr. 2, 2020

Related U.S. Application Data

(63) Continuation-in-part of application No. 15/906,098, filed on Feb. 27, 2018, now Pat. No. 10,784,211.

(60) Provisional application No. 62/848,063, filed on May 15, 2019, provisional application No. 62/781,120, filed on Dec. 18, 2018, provisional application No. 62/470,915, filed on Mar. 14, 2017.

(51) Int. Cl.
 *H01L 23/00* (2006.01)
 *H01L 23/053* (2006.01)
 *H01L 23/367* (2006.01)
 *H01L 23/31* (2006.01)
 *H01L 25/16* (2006.01)
 *H01L 23/498* (2006.01)

(52) U.S. Cl.
 CPC .......... *H01L 23/562* (2013.01); *H01L 23/053* (2013.01); *H01L 23/3128* (2013.01); *H01L 23/3135* (2013.01); *H01L 23/367* (2013.01); *H01L 23/49822* (2013.01); *H01L 25/165* (2013.01)

(58) Field of Classification Search
 None
 See application file for complete search history.

(56) References Cited

U.S. PATENT DOCUMENTS

| 5,841,194 | A  | 11/1998 | Tsukamoto |
| 6,020,221 | A  | 2/2000 | Lim et al. |
| 8,247,900 | B2 | 8/2012 | Tuan |
| 8,710,629 | B2 | 4/2014 | Bai et al. |

(Continued)

FOREIGN PATENT DOCUMENTS

| CN | 1163480 A | 10/1997 |
| CN | 102110660 A | 6/2011 |

(Continued)

OTHER PUBLICATIONS

European Search Report dated May 6, 2020, issued in application No. EP 19213567.1.

(Continued)

*Primary Examiner* — Long Pham
(74) *Attorney, Agent, or Firm* — McClure, Qualey & Rodack, LLP

(57) ABSTRACT

A semiconductor package structure is provided. The semiconductor package structure includes a substrate, a semiconductor die and a frame. The semiconductor die is disposed over the substrate. The frame is disposed over the substrate, wherein the frame is adjacent to the semiconductor die, and the upper surface of the frame is lower than the upper surface of the semiconductor die.

18 Claims, 12 Drawing Sheets

(56) References Cited

U.S. PATENT DOCUMENTS

| | | | |
|---|---|---|---|
| 9,209,048 B2 | 12/2015 | Huang et al. | |
| 9,412,662 B2 | 8/2016 | Lin et al. | |
| 9,425,171 B1 | 8/2016 | Minacapelli et al. | |
| 9,543,249 B1 | 1/2017 | Hu | |
| 10,529,645 B2 | 1/2020 | Gandhi et al. | |
| 2001/0017408 A1 | 8/2001 | Baba | |
| 2002/0011907 A1* | 1/2002 | Yamada | H05K 3/4688 333/204 |
| 2004/0150118 A1* | 8/2004 | Honda | H01L 23/24 257/778 |
| 2005/0186769 A1 | 9/2005 | Young | |
| 2007/0001278 A1 | 1/2007 | Jeon et al. | |
| 2007/0069366 A1 | 3/2007 | Chang et al. | |
| 2007/0194464 A1 | 8/2007 | Fukuzono | |
| 2008/0054490 A1* | 3/2008 | McLellan | H01L 21/563 257/778 |
| 2008/0179725 A1 | 7/2008 | Chia et al. | |
| 2008/0237840 A1 | 10/2008 | Alcoe et al. | |
| 2008/0258293 A1 | 10/2008 | Yang et al. | |
| 2009/0236730 A1 | 9/2009 | Topacio et al. | |
| 2010/0276799 A1* | 11/2010 | Heng | H01L 23/36 257/704 |
| 2011/0156235 A1 | 6/2011 | Yuan | |
| 2012/0018871 A1* | 1/2012 | Lee | H01L 23/4334 257/698 |
| 2012/0182694 A1 | 7/2012 | Lin et al. | |
| 2012/0188721 A1 | 7/2012 | Ho et al. | |
| 2013/0234304 A1 | 9/2013 | Tamaki | |
| 2014/0070423 A1 | 3/2014 | Woychik et al. | |
| 2015/0186769 A1 | 7/2015 | Boiron et al. | |
| 2015/0187737 A1 | 7/2015 | Lin et al. | |
| 2015/0260929 A1 | 9/2015 | Matsumaru et al. | |
| 2016/0351467 A1 | 12/2016 | Li | |
| 2017/0018510 A1 | 1/2017 | Shen et al. | |
| 2018/0138127 A1 | 5/2018 | Lee et al. | |
| 2018/0175001 A1 | 6/2018 | Pyo et al. | |
| 2018/0204807 A1 | 7/2018 | Aizawa | |
| 2018/0237840 A1 | 8/2018 | Marggraf-Rogalla et al. | |
| 2018/0269164 A1 | 9/2018 | Lin et al. | |
| 2018/0350772 A1* | 12/2018 | Nair | H01Q 1/38 |
| 2018/0374820 A1* | 12/2018 | Ko | H01L 21/4857 |
| 2019/0115269 A1 | 4/2019 | Pan et al. | |

FOREIGN PATENT DOCUMENTS

| | | |
|---|---|---|
| CN | 201936868 U | 8/2011 |
| CN | 103038877 A | 4/2013 |
| CN | 103066029 A | 4/2013 |
| CN | 203659838 U | 6/2014 |
| DE | 198 30 158 A1 | 4/1999 |
| DE | 10 2013 200 518 A | 7/2013 |
| EP | 0 797 253 A2 | 9/1997 |
| EP | 2 066 160 A2 | 6/2009 |
| EP | 3 376 535 A1 | 9/2018 |
| JP | 2003-017625 A | 1/2003 |
| JP | 2004-247464 A | 9/2004 |
| KR | 10-2008-0093909 A | 10/2008 |
| TW | 201546954 A | 12/2015 |
| TW | 201546954 A2 | 12/2015 |
| TW | 201608653 A | 3/2016 |
| TW | 201705414 A | 2/2017 |
| TW | M563659 U | 7/2018 |
| TW | 201834164 A | 9/2018 |
| TW | M572570 U | 1/2019 |
| WO | 2013/119309 A1 | 8/2013 |

OTHER PUBLICATIONS

Chinese language office action dated May 7, 2020, issued in application No. CN 201810189557.2.
European Search Report dated May 27, 2020, issued in application No. EP 20162559.7.
Chinese language office action dated Jun. 19, 2020, issued in application TW 109108155.
Non-Final Office Action dated Oct. 21, 2020, issued in U.S. Appl. No. 16/563,919.
European Search Report dated Nov. 13, 2020, issued in application No. EP 20178978.1.
Chinese language office action dated Jan. 13, 2021, issued in application No. TW 109120165.
Chinese language office action dated Mar. 31, 2021, issued in application No. TW 108145283.
Chinese language office action dated Jun. 2, 2021, issued in application No. CN 201911261556.5.
Chinese language office action dated Sep. 14, 2021, issued in application No. TW 108145283.

* cited by examiner

SEMICONDUCTOR PACKAGE STRUCTURE

CROSS REFERENCE TO RELATED APPLICATIONS

This application is a continuation-in-part of U.S. patent application Ser. No. 15/906,098 filed on Feb. 27, 2018, which claims the benefit of U.S. Provisional Application No. 62/470,915 filed on Mar. 14, 2017, this application also claims the benefit of U.S. Provisional Application No. 62/781,120 filed on Dec. 18, 2018 and U.S. Provisional Application No. 62/848,063 filed on May 15, 2019, the entirety of which are incorporated by reference herein.

BACKGROUND OF THE INVENTION

Field of the Invention

The present invention relates to a semiconductor package structure, and in particular to a semiconductor package structure with holes formed on the top surface of a substrate therein.

Description of the Related Art

A semiconductor package can not only provide a semiconductor die with protection from environmental contaminants, but it can also provide an electrical connection between the semiconductor die packaged therein and a substrate, such as a printed circuit board (PCB). For instance, a semiconductor die may be enclosed in an encapsulating material, and traces are electrically connected to the semiconductor die and the substrate.

However, a problem with such a semiconductor package is that it is subject to different temperatures during the packaging process. The semiconductor package may be highly stressed due to the different coefficients of thermal expansion (CTEs) of the various substrate and semiconductor die materials. As a result, the semiconductor package may exhibit warping or cracking so that the electrical connection between the semiconductor die and the substrate may be damaged, and the reliability of the semiconductor package may be decreased.

This problem is exacerbated in the case of a relatively large package, for example a package of 50 mm×50 mm or larger. Therefore, a novel semiconductor package structure is desirable.

BRIEF SUMMARY OF THE INVENTION

Semiconductor package structures are provided. An exemplary embodiment of a semiconductor package structure includes a substrate having a first surface and a second surface opposite thereto. The substrate includes a wiring structure. The semiconductor package structure also includes a first semiconductor die disposed over the first surface of the substrate and electrically coupled to the wiring structure. The semiconductor package structure further includes a second semiconductor die disposed over the first surface of the substrate and electrically coupled to the wiring structure. The first semiconductor die and the second semiconductor die are separated by a molding material. In addition, the semiconductor package structure includes a first hole and a second hole formed on the second surface of the substrate.

Another exemplary embodiment of a semiconductor package structure includes a substrate having a wiring structure. The semiconductor package structure also includes a first semiconductor die disposed over the substrate and electrically coupled to the wiring structure. The semiconductor package structure further includes a second semiconductor die disposed over the substrate and electrically coupled to the wiring structure. The first semiconductor die and the second semiconductor die are arranged side-by-side. In addition, the semiconductor package structure includes a plurality of holes formed on a surface of the substrate. The holes are located within projections of the first semiconductor die and the second semiconductor die on the substrate.

Yet another exemplary embodiment of a substrate structure includes a wiring structure disposed in a substrate, wherein the wiring structure is coupled to a plurality of semiconductor dies disposed over the substrate. The substrate structure also includes a plurality of holes formed on a surface of the substrate, wherein the holes are located within projections of the semiconductor die on the substrate.

Another exemplary embodiment of a semiconductor package structure includes a substrate, a semiconductor die and a frame. The semiconductor die is disposed over the substrate. The frame is disposed over the substrate, wherein the frame is adjacent to the semiconductor die, and the upper surface of the frame is lower than the upper surface of the semiconductor die.

Another exemplary embodiment of a semiconductor package structure includes a substrate, a semiconductor die, a frame and a buffer layer. The semiconductor die is disposed over the substrate. The frame is disposed over the substrate. The buffer layer is disposed on the substrate and located between the semiconductor die and the frame, wherein the upper surface of the frame is substantially level with the upper surface of the buffer layer.

Another exemplary embodiment of a semiconductor package structure includes a substrate, a semiconductor die and a buffer layer. The semiconductor die is disposed over the substrate. The buffer layer is disposed on the semiconductor die and located adjacent to the semiconductor die, wherein the upper surface of the buffer layer is substantially level with the upper surface of the semiconductor die.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1A is a cross-sectional view of the semiconductor package structure along line I-I' of FIG. 1C;

DETAILED DESCRIPTION OF THE INVENTION

Figure 1A:
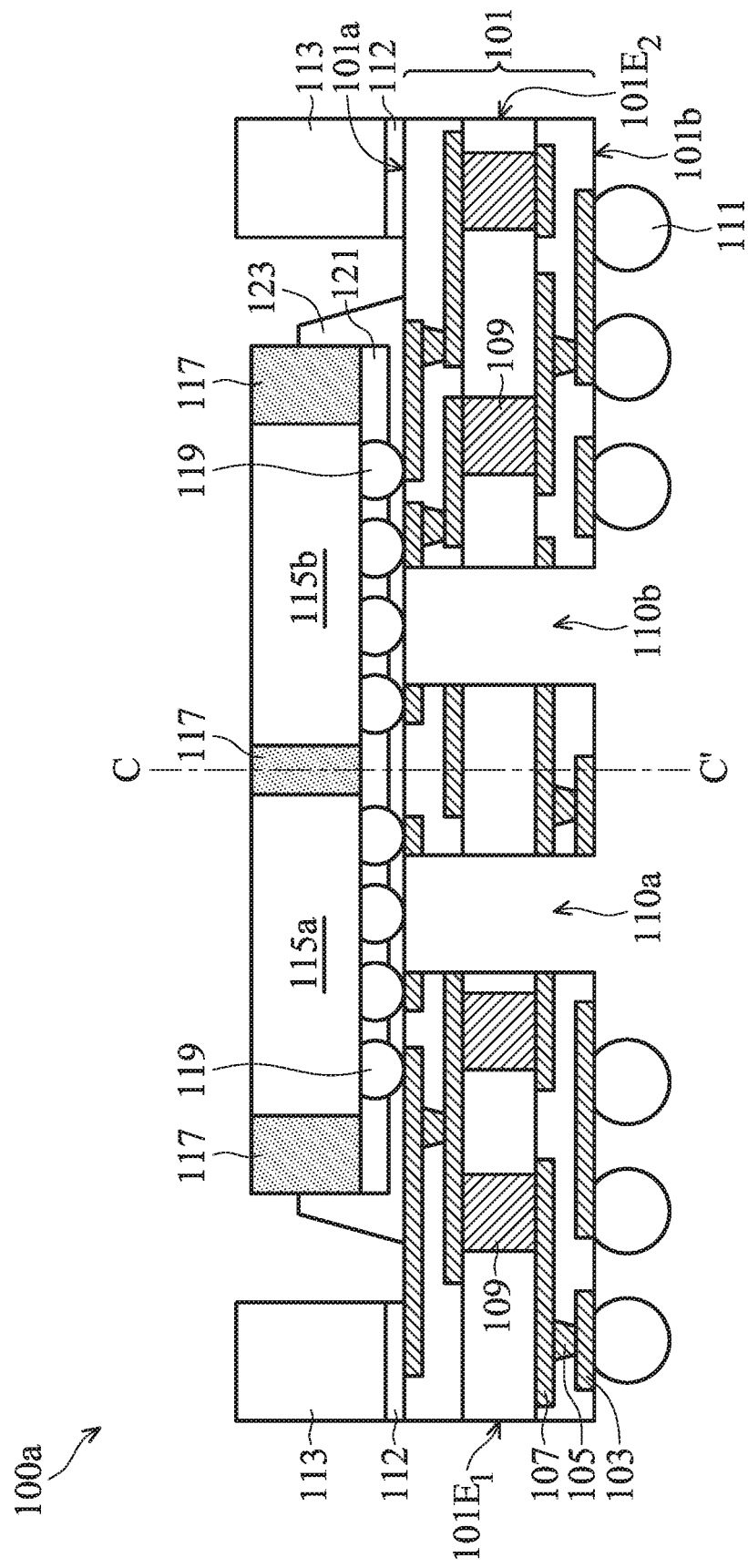
FIG. 1A is a cross-sectional view of a semiconductor package structure, in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1A is a cross-sectional view of a semiconductor package structure 100a, in accordance with some embodiments of the disclosure. FIG. 1C is a plan view of an arrangement of holes in a substrate 101 of the semiconductor package structure 100a shown in FIG. 1A, and FIG. 1A is a cross-sectional view of the semiconductor package structure 100a along line I-I' of FIG. 1C.

Additional features can be added to the semiconductor package structure 100a. Some of the features described below can be replaced or eliminated for different embodiments. To simplify the diagram, only a portion of the semiconductor package structure 100a is depicted in FIGS. 1A and 1C. In some embodiments, the semiconductor package structure 100a may include a wafer-level semiconductor package, for example, a flip-chip semiconductor package.

Referring to FIG. 1A, the semiconductor package structure 100a may be mounted on a base (not shown). In some embodiments, the semiconductor package structure 100a may be a system-on-chip (SOC) package structure. Moreover, the base may include a printed circuit board (PCB) and may be formed of polypropylene (PP). In some embodiments, the base may include a package substrate. The semiconductor package structure 100a is mounted on the base by a bonding process. For example, the semiconductor package structure 100a includes bump structures 111. In some embodiments, the bump structures 111 may be conductive ball structures (such as ball grid array (BGA)), conductive pillar structures, or conductive paste structures that are mounted on and electrically coupled to the base in the bonding process.

In the embodiment, the semiconductor package structure 100a includes a substrate 101. The substrate 101 has a wiring structure therein. In some embodiments, the wiring structure in the substrate 101 is a fan-out structure, and may include one or more conductive pads 103, conductive vias 105, conductive layers 107 and conductive pillars 109. In such cases, the wiring structure in the substrate 101 may be disposed in one or more inter-metal dielectric (IMD) layers. In some embodiments, the IMD layers may be formed of organic materials, which include a polymer base material, non-organic materials, which include silicon nitride ($SiN_x$), silicon oxide ($SiO_x$), grapheme, or the like. For example, the IMD layers are made of a polymer base material. It should be noted that the number and configuration of the IMD layers, the conductive pads 103, the conductive vias 105, the conductive layers 107 and the conductive pillars 109 shown in Figures and only some examples and are not limitations to the present invention.

Moreover, the semiconductor package structure 100a also includes a first semiconductor die 115a and a second semiconductor die 115b bonded onto the substrate 101 through a plurality of conductive structures 119. The substrate 101 has a first surface 101a and a second surface 101b opposite thereto, the first surface 101a is facing the first semiconductor die 115a and the second semiconductor die 115b, and the second surface 101b is facing the above-mentioned base. The conductive structures 119 are disposed over the first surface 101a and below the first semiconductor die 115a and the second semiconductor die 115b, and the bump structures 111 are disposed over the second surface 101b of the substrate 101.

In some embodiments, the first semiconductor die 115a and the second semiconductor die 115b are electrically coupled to the bump structures 111 through the conductive structures 119 and the wiring structure in the substrate 101. In addition, the conductive structures 119 may be controlled collapse chip connection (C4) structures. It should be noted that the number of semiconductor dies integrated in the semiconductor package structure 100a is not limited to that disclosed in the embodiment.

In some embodiments, the first semiconductor die 115a and the second semiconductor die 115b are active devices. For example, the first semiconductor die 115a and the second semiconductor die 115b may be logic dies including a central processing unit (CPU), a graphics processing unit (GPU), a dynamic random access memory (DRAM) controller or any combination thereof. In some other embodiments, one or more passive devices are also bonded onto the substrate 101.

The first semiconductor die 115a and the second semiconductor dies 115b are arranged side-by-side. In some embodiments, the first semiconductor die 115a and the second semiconductor dies 115b are separated by a molding material 117. The molding material 117 surrounds the first semiconductor die 115a and the second semiconductor die 115b, and adjoins the sidewalls of the first semiconductor die 115a and the second semiconductor die 115b. In some embodiments, the molding material 117 includes a nonconductive material such as an epoxy, a resin, a moldable polymer, or another suitable molding material. In some embodiments, the molding material 117 is applied as a substantial liquid, and then is cured through a chemical reaction. In some other embodiments, the molding material 117 is an ultraviolet (UV) or thermally cured polymer applied as a gel or malleable solid, and then is cured through a UV or thermal curing process. The molding material 117 may be cured with a mold (not shown).

In some embodiments, the surfaces of the first semiconductor die 115a and the second semiconductor dies 115b facing away from the first surface 101a of the substrate 101 are exposed by the molding material 117, such that a heat dissipating device (not shown) can directly attached to the surfaces of the first semiconductor die 115a and the second semiconductor dies 115b. As a result, the heat-dissipation efficiency of the semiconductor package structure 100a can be improved, particularly for a large semiconductor package structure, such as 50 mm×50 mm, which is preferred for high-power applications.

The semiconductor package structure 100a also includes a polymer material 121 disposed under the molding material 117, the first semiconductor die 115a and the second semiconductor die 115b, and between the conductive structures 119. The semiconductor package structure 100a further includes an underfill layer 123 interposed between the first surface 101a of the substrate 101 and the polymer material 121. In some embodiments, the first semiconductor die 115a, the second semiconductor dies 115b and the molding material 117 are surrounded by the underfill layer 123. The polymer material 121 and the underfill layer 123 are disposed to compensate for differing coefficients of thermal expansion (CTEs) between the substrate 101, the conductive structures 119, the first semiconductor die 115a and the second semiconductor dies 115b.

In addition, the semiconductor package structure 100a includes a frame 113 attached to the first surface 101a of the substrate 101 through an adhesive layer 112. The first semiconductor die 115a and the second semiconductor die 115b are surrounded by the frame 113 and the adhesive layer 112. In some embodiments, the frame 113 and the adhesive layer 112 are separated from the underfill layer 121 by a gap. The substrate 101 has a first edge 101E$_1$ and a second edge 101E$_2$ opposite thereto. In some embodiments, the first edge 101 E$_1$ and the second edge 101E$_2$ are coplanar with sidewalls of the frame 113 and the adhesive layer 112.

Still referring to FIG. 1A, the substrate 101 of the semiconductor package structure 100a includes a first hole 110a and a second hole 110b formed on the second surface 101b. In some embodiments, at least one of the first hole 110a and the second hole 110b penetrates through the substrate 101 from the first surface 101a to the second surface 101b. Although the first hole 110a and the second hole 110b shown in FIG. 1A penetrate through the substrate 101, in some other embodiments, both the first hole 110a and the second hole 110b do not penetrate through the substrate 101 from the first surface 101a to the second surface 101b. In some embodiments, the first hole 110a is covered by the first semiconductor die 115a, and the second hole 110b is covered by the second semiconductor die 115b. In other words, the first hole 110a is located within the projection of the first semiconductor die 115a on the substrate 101, and the second hole 110b is located within the projection of the second semiconductor die 115b on the substrate 101.

Specifically, the first semiconductor die 115a and the second semiconductor die 115b have a center line C-C' between them. The first hole 110a is disposed closer to the center line C-C' than the first edge 101E$_1$ of the substrate 101, and the second hole 110b is disposed closer to the center line C-C' than the second edge 101E$_2$ of the substrate 101. Although there are only two holes in the substrate 101 shown in FIG. 1A, it should be noted that there is no limitation on the number of the holes formed in the substrate 101.

In some embodiments, the first hole 110a and the second hole 110b are formed by a laser drilling process or another suitable process. It should be noted that the first hole 110a and the second hole 110b may be formed by the same forming process for the conductive pillars 109 in the wiring structure of the substrate 101. Moreover, the first semiconductor die 115a and the second semiconductor die 115b are bonded to the substrate 101 after forming the holes in the substrate 101. Therefore, the damage of the first semiconductor die 115a and the second semiconductor die 115b can be prevented.

Referring to FIG. 1C, which is a plan view of an arrangement of holes in a substrate 101 of the semiconductor package structure 100a shown in FIG. 1A, and FIG. 1A is a cross-sectional view of the semiconductor package structure 100a along line I-I' of FIG. 1C. It should be noted that FIG. 1C is the plan view from the bottom of the semiconductor package structure 100a. In other words, FIG. 1C is the plan view from the second surface 101b of the substrate 101, which the bump structures 111 are disposed on. In particular, the bump structures 111 are omitted for brevity.

As shown in FIG. 1C, the substrate 101 includes more than two holes. In particular, the substrate 101 further includes a third hole 110c and the fourth hole 110d formed on the second surface 101b. The third hole 110c is covered by the first semiconductor die 115a, and the fourth hole 110d is covered by the second semiconductor die 115b. It should be noted that the substrate 101 has a center 101C, and the first hole 101a, the second hole 101b, the third hole 110c, and the fourth hole 110d are disposed closer to the center 101C than the first edge 101E$_1$ and the second edge 101E$_2$ of the substrate 101.

The holes formed in the substrate 101, for example, the first hole 110a, the second hole 110b, the third hole 110c and the fourth hole 110d, are designed to release the stress in the substrate 101, especially the stress concentrated in the region below the interface between two semiconductor dies (i.e. the first semiconductor die 115a and the second semiconductor die 115b). Since the semiconductor package structure 100a may be highly stressed due to the different coefficients of thermal expansion (CTEs) of the substrate 101 and the semiconductor dies, the holes formed in the substrate 101 can solve the warping or cracking problems caused by mismatched CTEs. As a result, the electrical connection within the semiconductor package structure 100a may not be damaged, and the reliability of the semiconductor package structure 100a may be increased.

Figure 1B:
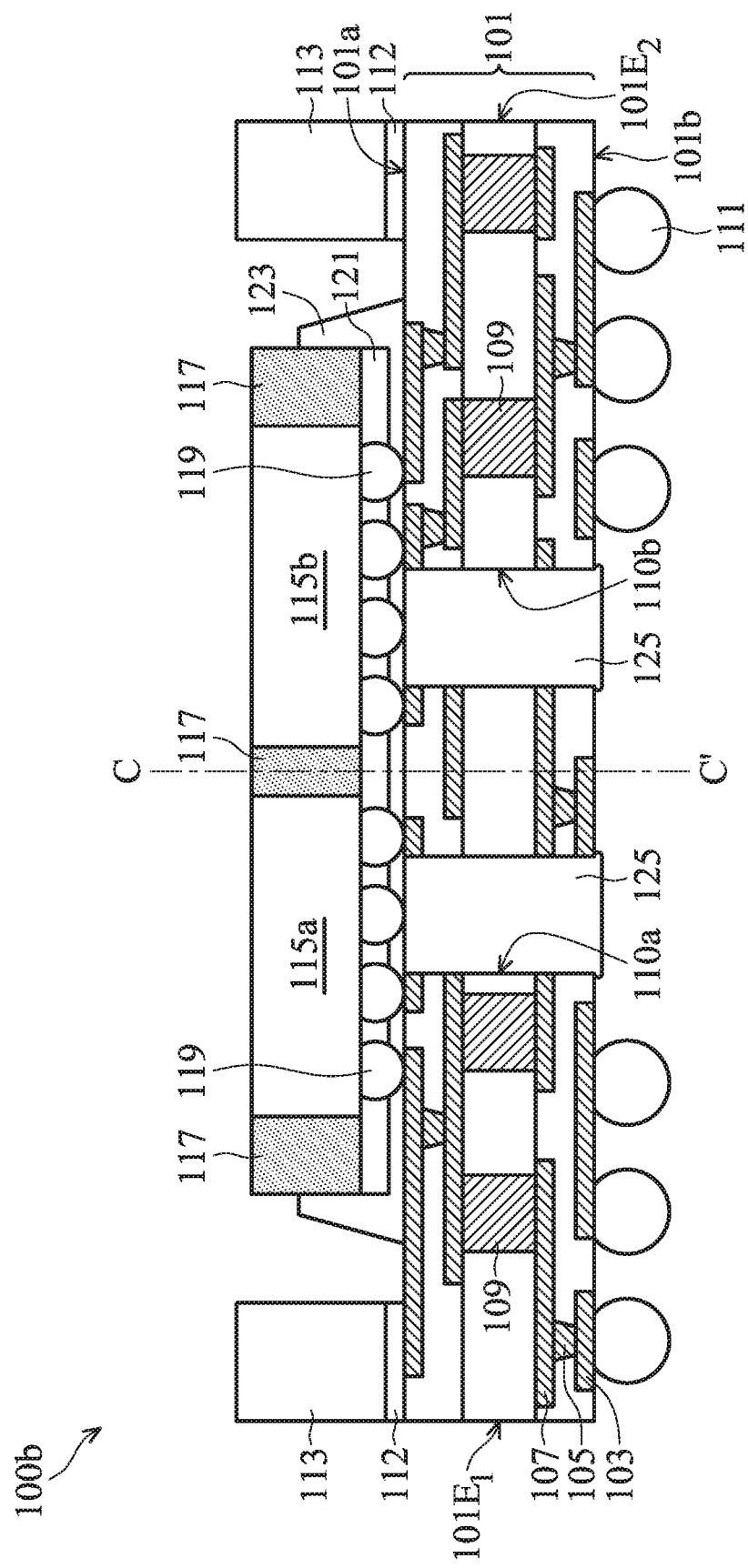
FIG. 1B is a cross-sectional view of a semiconductor package structure, in accordance with some other embodiments of the disclosure.
Figure 1C:
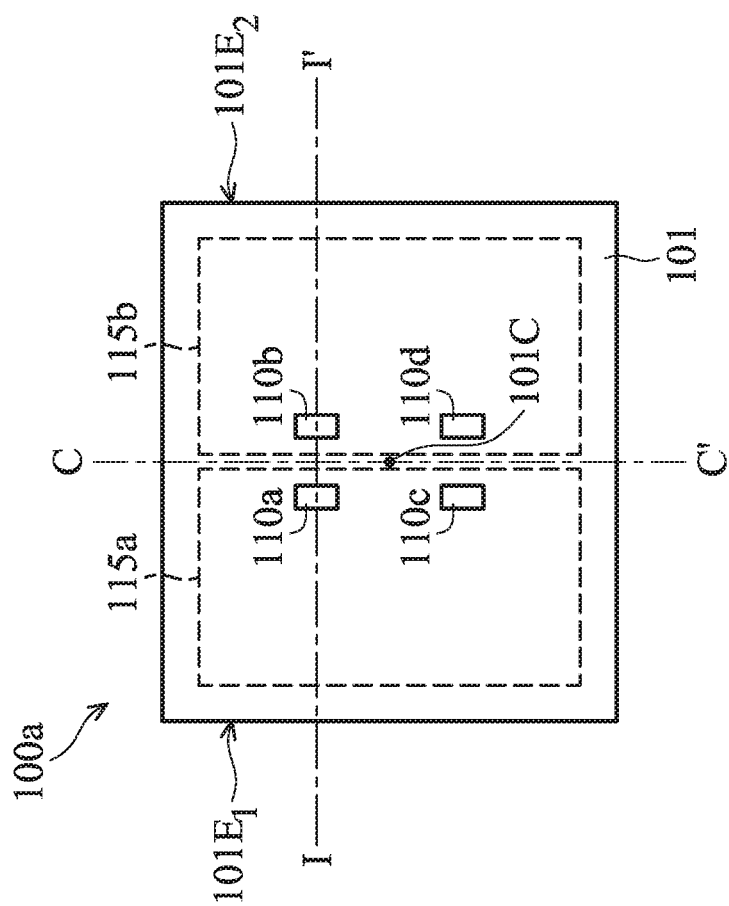
FIG. 1C is a plan view of an arrangement of holes in a substrate of the semiconductor package structure shown in FIG. 1A.

FIG. 1B is a cross-sectional view of a semiconductor package structure 100b, in accordance with some other embodiments of the disclosure. Descriptions of elements of the embodiments hereinafter that are the same as or similar to those previously described with reference to FIG. 1A are omitted for brevity.

As shown in FIG. 1B, the semiconductor package structure 100b includes a stress buffer layer 125 filled in the first hole 110a and the second hole 110b. The stress buffer layer 125 is made of a polymer material, such as a silicone resin or rubber. In some embodiments, the stress buffer layer 125 is made of an organic resin, such as Ajinomoto Build-up Film (ABF).

Moreover, the stress buffer layer 125 may be formed by a spin coating process. In some other embodiments, a material of the stress buffer layer 125 may be dispensed in the first hole 110a and the second hole 110b, and an excess portion of the material of the stress buffer layer 125 may be removed. In some embodiments, the stress buffer layer 125 may be formed before bonding the first semiconductor die 115a and the second semiconductor die 115b to the substrate 101.

In some embodiments, the stress buffer layer 125 may filled up the first hole 110a and the second hole 110b, and the surfaces of the stress buffer layer 125 are level with the second surface 101b of the substrate 101. In some other embodiments, the surfaces of the stress buffer layer 125 may not be level with the second surface 101b of the substrate 101 according to the actual manufacturing processes.

Filling the first hole 110a and the second hole 110b with the stress buffer layer 125 may offer advantages like preventing the impurities and dust from dropping into the first hole 110a and the second hole 110b during the process of handling the substrate 101. In addition, the warping or cracking caused by mismatched coefficients of thermal expansion in the semiconductor package structure 100b can be solved by the holes (including the first hole 110a and the second hole 110b) and the stress buffer layer 125 formed in the substrate 101. Accordingly, the electrical connection within the semiconductor package structure 100b may not be damaged, and the lifespan of the semiconductor package structure 100b may be increased.

Figure 2B:
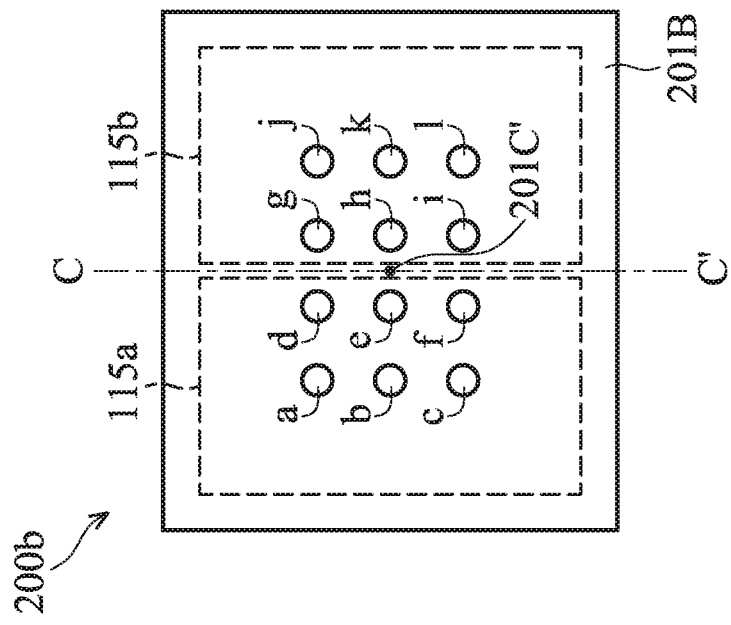
FIGS. 2A-2B are plan views showing shapes of holes in substrates of semiconductor package structures, in accordance with some embodiments of the disclosure.
Figure 2A:
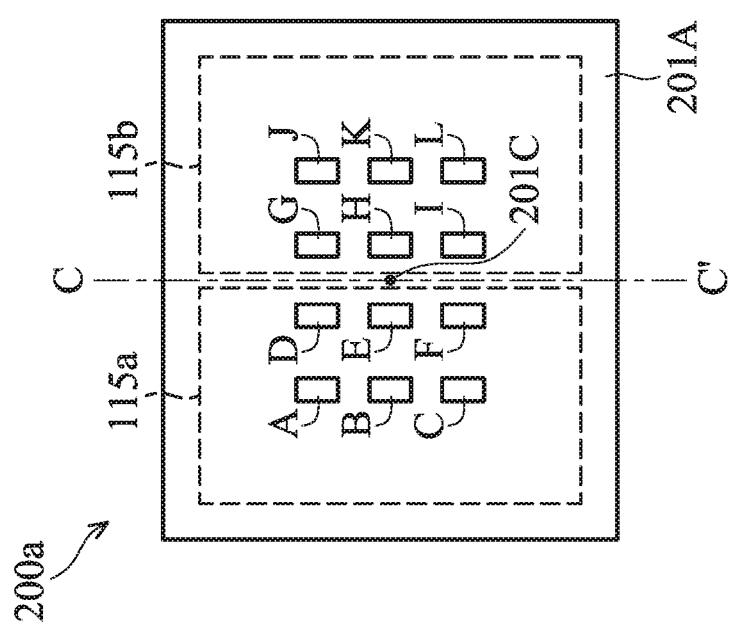

FIG. 2A is a plan view showing shapes of holes in a substrate 201A of a semiconductor package structure 200a, and FIG. 2B is a plan view showing shapes of holes in a substrate 201B of a semiconductor package structure 200b, in accordance with some embodiments of the disclosure. Descriptions of elements of the embodiments hereinafter that are the same as or similar to those previously described with reference to FIG. 1C are omitted for brevity.

Referring to FIG. 2A, the semiconductor package structure 200a has holes A, B, C, D, E, F, G, H, I, J, K and L in the substrate 201A, and the number of holes in the substrate 201A is much more than that in the substrate 101 of the semiconductor package structure 100a. As shown in FIG. 2A, the holes A, B, C, D, E and F are covered by the first semiconductor die 115a, and the holes G, H, I, J, K and L are covered by the second semiconductor die 115b. In other words, the holes A-F are located within the projection of the first semiconductor die 115a on the substrate 201A, and the holes G-L are located within the projection of the second semiconductor die 115b on the substrate 201A.

Specifically, the holes A, B and C are arranged in a first array, the holes D, E and F are arranged in a second array, the holes G, H and I are arranged in a third array, and the holes J, K and L are arranged in a fourth array. The first array, the second array, the third array and the fourth array are parallel to the center line C-C' of the first semiconductor die 115a and the second semiconductor die 115b.

Referring to FIG. 2B, the substrate 201B in the semiconductor package structure 200b has holes a, b, c, d, e, f, g, h, i, j, k and l, which are arranged in the same way as the holes A-L of the substrate 201A in the semiconductor package structure 200a. The difference between the substrate 201A and the substrate 201B is that the holes a-l have circular shapes in the plan view. Compared with the holes A-L in the substrate 201A, which have rectangular shapes in the plan view, the problems of stress concentrated at the corners of the holes A-L can be prevented in the substrate 201B due to the round shapes of the holes a-l. Therefore, the probability that the cracking problem occurs in the substrate 201B of the semiconductor package structure 200b can be more decreased.

In some embodiments, stress buffer layers may be optionally formed in the holes A-L of the semiconductor package structure 200a and in the holes a-l of the semiconductor package structure 200b. It should be noted that the holes A-L are symmetrically located about the center line C-C' in the plan view of FIG. 2A, and the holes a-l are symmetrically located about the center line C-C' in the plan view of FIG. 2B. In some other embodiments, the holes A-L are symmetrically located about the center 201C of the substrate 201A in the plan view of FIG. 2A, and the holes a-l are symmetrically located about the center 201C' of the substrate 201B in the plan view of FIG. 2B.

Figure 3B:
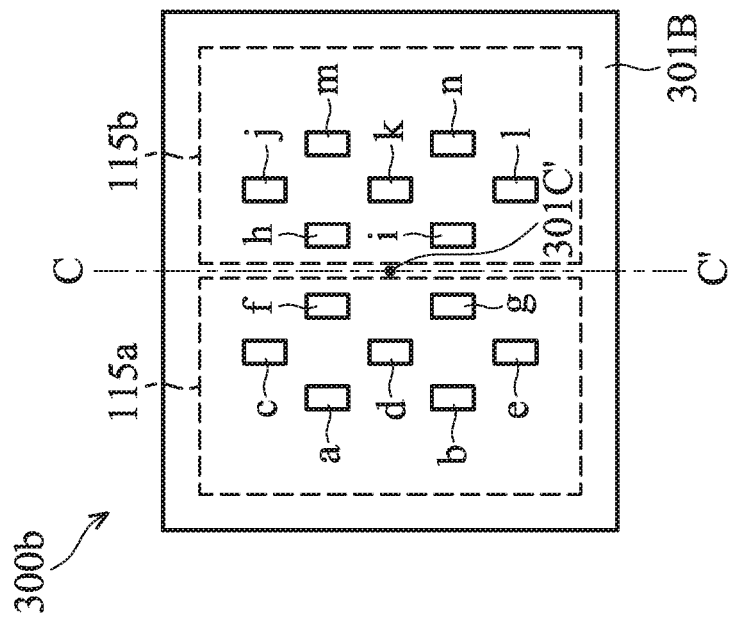
FIGS. 3A-3B are plan views showing arrangements of holes in substrate of semiconductor package structures, in accordance with some embodiments of the disclosure.
Figure 3A:
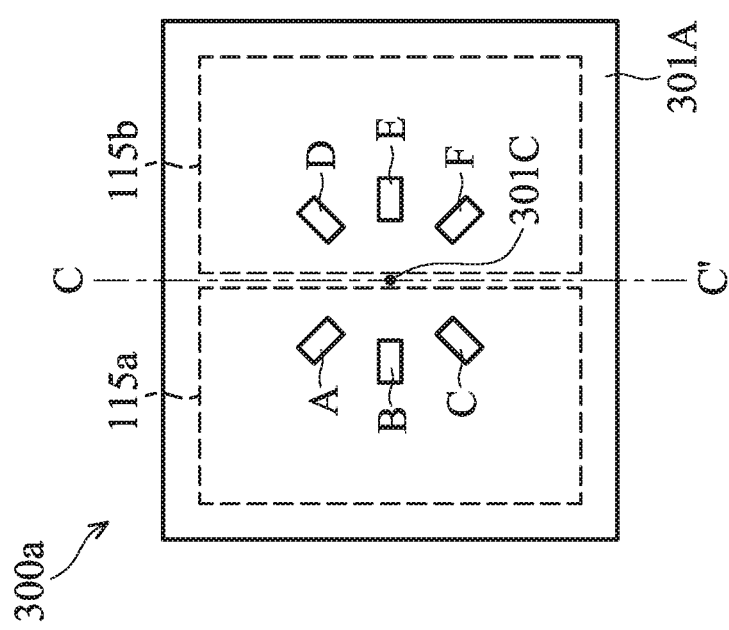

FIG. 3A is a plan view showing arrangements of holes in a substrate 301A of a semiconductor package structure 300a, and FIG. 3B is a plan view showing arrangements of holes in a substrate 301B of a semiconductor package structure 300b, in accordance with some embodiments of the disclosure. Descriptions of elements of the embodiments hereinafter that are the same as or similar to those previously described with reference to FIG. 2A are omitted for brevity.

Referring to FIG. 3A, the semiconductor package structure 300a has holes A, B, C, D, E, and F in the substrate 301A. The holes A, B and C are covered by the first semiconductor die 115a, and the holes D, E and F are covered by the second semiconductor die 115b. In other words, the holes A-C are located within the projection of the first semiconductor die 115a on the substrate 301A, and the holes D-F are located within the projection of the second semiconductor die 115b on the substrate 301A.

It should be noted that the holes A-F are arranged radially around the center 301C of the substrate 301A. In some other embodiments, the holes A-F are arranged radially around a center, and the center is located between the first semiconductor die 115a and the second semiconductor die 115b.

Compared with the semiconductor substrate 200a of FIG. 2A, the stress in the substrate 301A of the semiconductor package structure 300a, which has holes A-F arranged radially, can be released more efficiently. In other words, in order to obtain the same stress releasing effect as in the semiconductor package structure 200a, the number of the holes in the substrate 301A of the semiconductor package structure 300a can be less than the number of the holes in the substrate 201A of the semiconductor package structure 200a. However, the substrate 201A of the semiconductor package structure 200a, which has holes A-L arranged parallel to the center line C-C', is more easily to be manufactured than the substrate 301A of the semiconductor package structure 300a, which has holes A-F arranged radially.

Referring to FIG. 3B, the substrate 301B in the semiconductor package structure 300b has holes a, b, c, d, e, f, g, h, i, j, k, l, m and n arranged staggered in the substrate 301B. Specifically, the holes a-g are covered by the first semiconductor die 115a and staggered disposed along the direction of the center line C-C', and the holes h-n are covered by the second semiconductor die 115b and staggered disposed along the direction of the center line C-C'.

Compared with the semiconductor package structure 200a in FIG. 2A and the semiconductor package structure 300a in FIG. 3A, the substrate 301B of the semiconductor package structure 300b can combine the above-mentioned benefits of the hole arrangements of the substrate 201A in the semiconductor package structure 200a and the substrate 301A of the semiconductor package structure 300a. Specifically, the holes a-n in the substrate 301B can be manufactured easily, and the stress in the substrate 301B can be released efficiently.

In some embodiments, stress buffer layers may optionally be formed in the holes A-F of the semiconductor package structure 300a and the holes a-n of the semiconductor package structure 300b. It should be noted that the holes A-F are symmetrically located about the center line C-C' in the plan view of FIG. 3A, and the holes a-n are symmetrically located about the center line C-C' in the plan view of FIG. 3B. In some other embodiments, the holes A-F are symmetrically located about the center 301C of the substrate 301A in the plan view of FIG. 3A, and the holes a-n are symmetrically located about the center 301C' of the substrate 301B in the plan view of FIG. 3B.

Figure 4B:
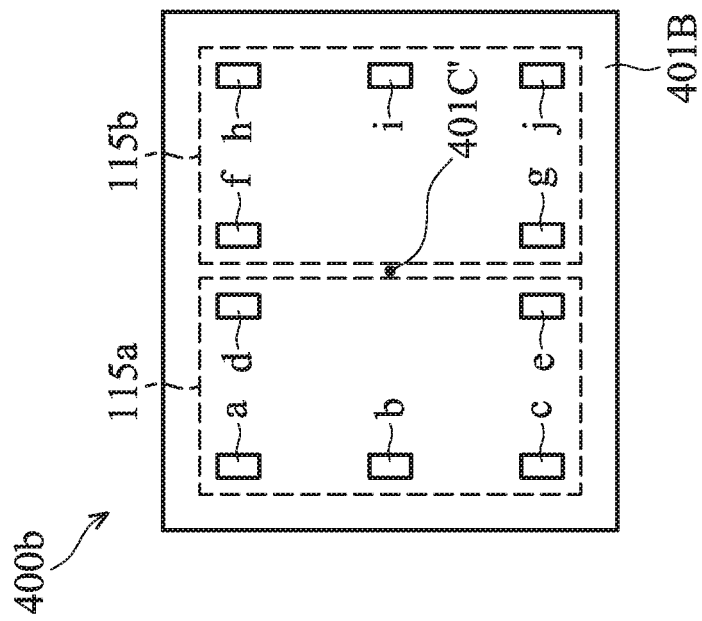
FIGS. 4A-4B are plan views showing locations of holes in substrates of semiconductor package structures, in accordance with some embodiments of the disclosure.
Figure 4A:
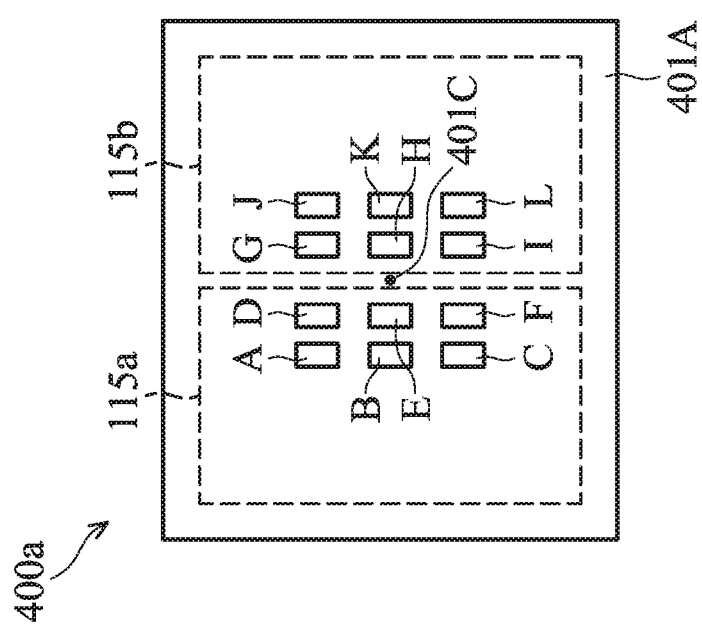

FIG. 4A is a plan view showing locations of holes in a substrate 401A of a semiconductor package structure 400a, and FIG. 4B is a plan view showing locations of holes in a substrate 401B of a semiconductor package structure 400b, in accordance with some embodiments of the disclosure. Descriptions of elements of the embodiments hereinafter that are the same as or similar to those previously described with reference to FIG. 2A are omitted for brevity.

Referring to FIG. 4A, the substrate 401A in the semiconductor package structure 400a has holes A, B, C, D, E, F, G, H, I, J, K and L arranged in the same way as the holes A-L of the substrate 201A in the semiconductor package structure 200a shown in FIG. 2A. The holes A-L are arranged parallel to the center line C-C' in the substrate 401A. The difference between FIGS. 2A and 4A is that the holes A-L in the substrate 401A are located closer to the center 401C of the substrate 401A than the holes A-L in the substrate 201A.

Since the maximum stress is likely to be concentrated at the center 401C of the substrate 401A, the stress in the substrate 401A of the semiconductor package structure 400a, which has holes A-L located closer to the center 401C of the substrate 401A, can be released more efficiently than the semiconductor package structure 200a.

Referring to FIG. 4B, the substrate 401B in the semiconductor package structure 400b has holes a, b, c, d, e, f, g, h, i and j located along the peripheral edge of the substrate 401B. In other words, the holes a-j are located far from the center 401C' of the substrate 401B to reserve space in the middle of the substrate 401B for routing. Compared with the semiconductor substrate 400a of FIG. 4A, the semiconductor substrate 400b of FIG. 4B can provide a better routing capability for the substrate 401B.

In some embodiments, stress buffer layers may optionally be formed in the holes A-L of the semiconductor package structure 400a and the holes a-j of the semiconductor package structure 400b. It should be noted that the holes A-L are symmetrically located about the center line C-C' in the plan view of FIG. 4A, and the holes a-j are symmetrically located about the center line C-C' in the plan view of FIG. 4B. In some other embodiments, the holes A-L are symmetrically located about the center 401C of the substrate 401A in the plan view of FIG. 4A, and the holes a-j are symmetrically located about the center 401C' of the substrate 401B in the plan view of FIG. 4B.

Figure 5:
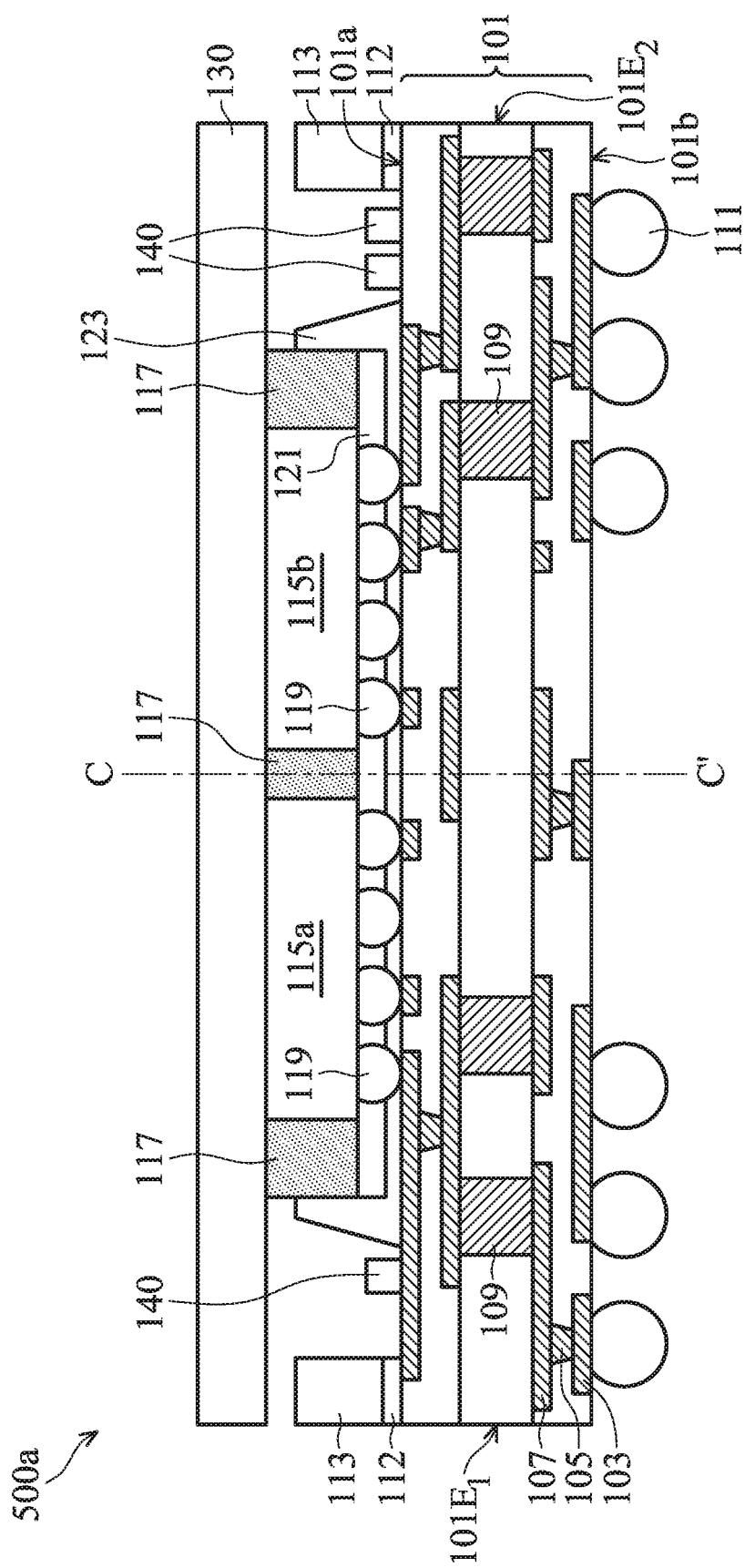
FIG. 5 is a cross-sectional view of a semiconductor package structure, in accordance with some other embodiments of the disclosure.

FIG. 5 is a cross-sectional view of a semiconductor package structure 500a, in accordance with some other embodiments of the disclosure. It should be noted that the semiconductor package structure 500a may include the same or similar portions as that of the semiconductor package structures 100a and 100b, and for the sake of simplicity, those portions will not be discussed in detail again. For example, the semiconductor package structure 500a includes a substrate 101, a first semiconductor die 115a, a second semiconductor die 115b and a frame 113. As shown in FIG. 5, the semiconductor package structure 500a further includes a heat sink 130 and a plurality of passive components 140, wherein the heat sink 130 is disposed on the first semiconductor die 115a and the second semiconductor die 115b, and the passive components 140 is disposed adjacent to one of the first semiconductor die 115a and the second semiconductor die 115b.

In the present embodiment, the heat sink 130 is configured to dissipate the heat generated by the first semiconductor die 115a and the second semiconductor die 115b during operation. In some embodiments, the heat sink 130 is in direct contact with the first semiconductor die 115a and the second semiconductor die 115b, such that the heat may be dissipated rapidly. In some other embodiments, a bonding layer (not shown) is disposed between the heat sink 130 and the first semiconductor die 115a, the second semiconductor die 115b in order to arrange the heat sink 130 more stably. In addition, the bonding layer may also help for eliminating the interstice (if present) between the heat sink and the semiconductor dies 115a, 115b, such that the thermal dissipation may also be improved.

As shown in FIG. 5, the upper surface of the frame 113 is lower than the upper surface of the semiconductor dies 115a, 115b. In other words, there is a gap between the frame 113 and the heat sink 130. It should be appreciated that the term "upper surface" of an element disposed over the substrate 101 is defined as a surface that is away from the substrate 101. In other words, the upper surface of the element is opposite to an surface that faces or contacts the first surface 101a of the substrate 101. Generally, the upper surface is substantially perpendicular to the center line C-C'. In addition, the terms "higher" and "lower" are referred to different positions along the center line C-C'. If an element or a portion is higher than another element or portion, the element or a portion is located farther away from the first surface 101a than the another element or portion, and vice versa. As viewed in a direction that is perpendicular to the upper surface of the semiconductor dies 115a, 115b, the heat sink 130 overlaps with the frame 113 and the semiconductor dies 115a, 115b. The above arrangement of the frame 113 may ensure the semiconductor dies 115a, 115b to contact the heat sink 130.

A plurality of passive components 140 are disposed on the substrate 101, and located between the frame 113 and the semiconductor dies 115a, 115b. It is noted that the passive components 140 are designed according to functional purposes of the semiconductor package structure 500a, and those skilled in the art may adjust the arrangement of the passive components 140 as required. For the sake of simplicity, the detailed description will not be provided herein.

Figure 6:
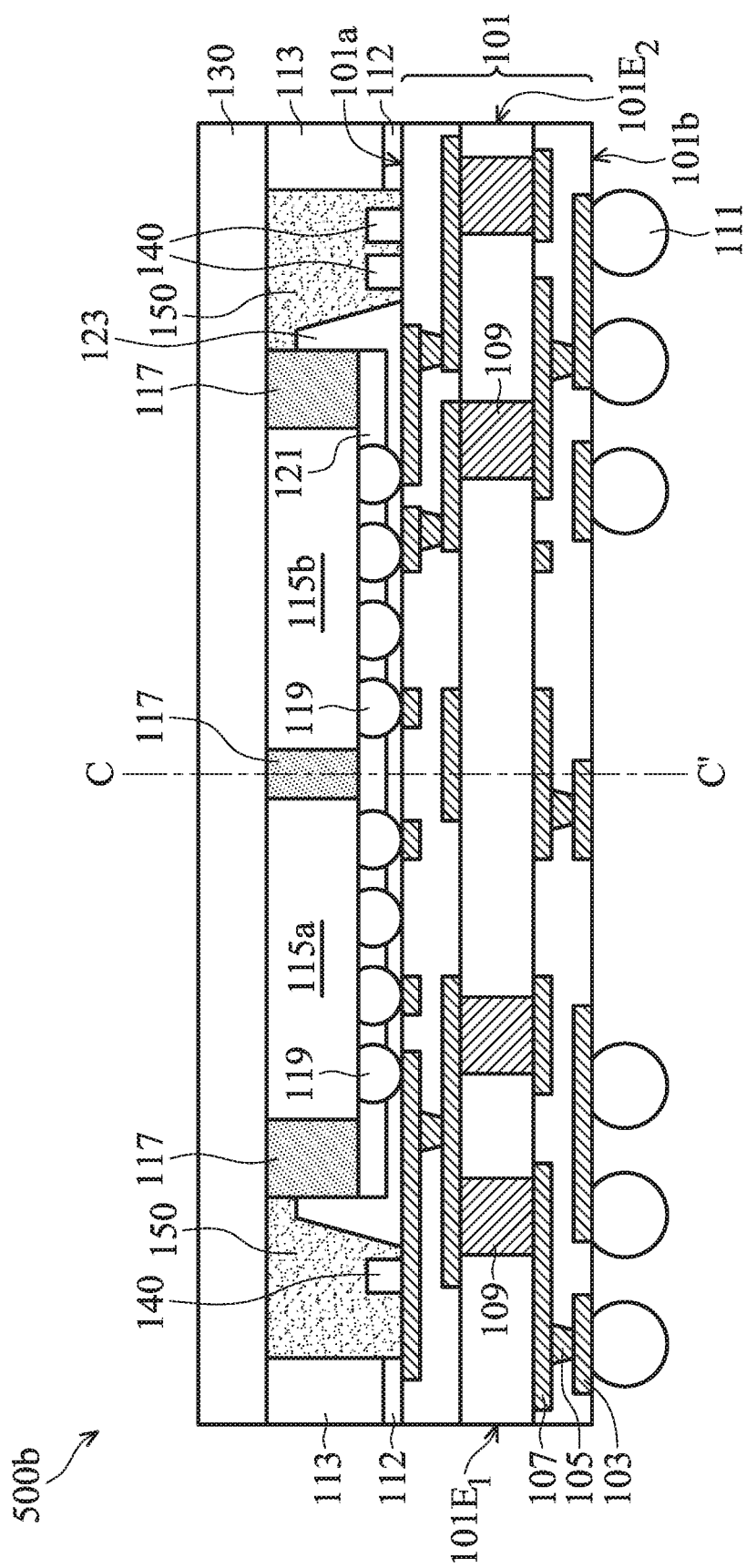
FIG. 6 is a cross-sectional view of a semiconductor package structure, in accordance with some other embodiments of the disclosure.
Figure 7:
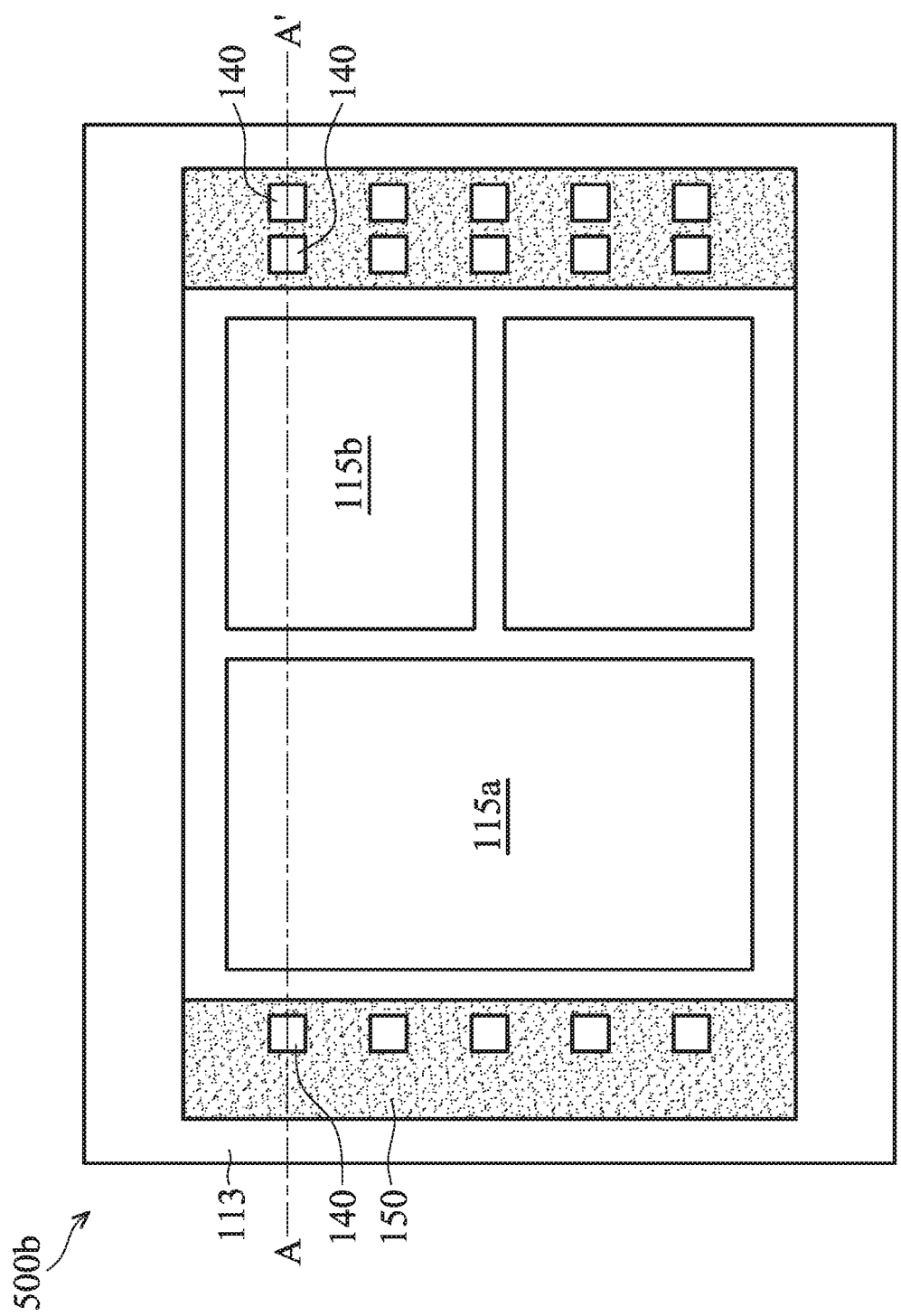
FIG. 7 is a top view of the semiconductor package structure shown in FIG. 6.

FIG. 6 is a cross-sectional view of a semiconductor package structure 500b, in accordance with some other embodiments of the disclosure, and FIG. 7 is a top view of the semiconductor package structure 500b shown in FIG. 6. FIG. 6 is illustrated along line A-A' shown in FIG. 7. It should be noted that the semiconductor package structure 500b may include the same or similar portions as that of the semiconductor package structure 500a, and for the sake of simplicity, those portions will not be discussed in detail again. For example, the semiconductor package structure 500b includes a substrate 101, a frame 113, semiconductor dies 115a, 115b and a heat sink 130.

As shown in FIG. 6, the semiconductor package structure 500b further includes a buffer layer 150 which is disposed on the substrate 101 and located between the frame 113 and the semiconductor dies 115a, 115b. In the present embodiment, upper surfaces of the frame 113, the buffer layer 150 and the semiconductor dies 115a, 115b are located on the same imaginary plane. That is, the upper surface of the frame 113 is substantially level with the upper surfaces of the frame 113 and the semiconductor dies 115a, 115b. In the present embodiment, the passive components 140 may be surrounded by the buffer layer 150. For example, the buffer layer 150 includes polymer materials, but it is not limited thereto. Thanks to the arrangement of the buffer layer 150, the passive components 140 may be protected and the thermal dissipation may be further improved since the thermal conductivity of the buffer layer 150 is greater than that of air. In addition, the warpage issue of the semiconductor package structure 500a may also be reduced since the substrate 101 may be supported by the frame 113 and/or the buffer layer 150.

Figure 8:
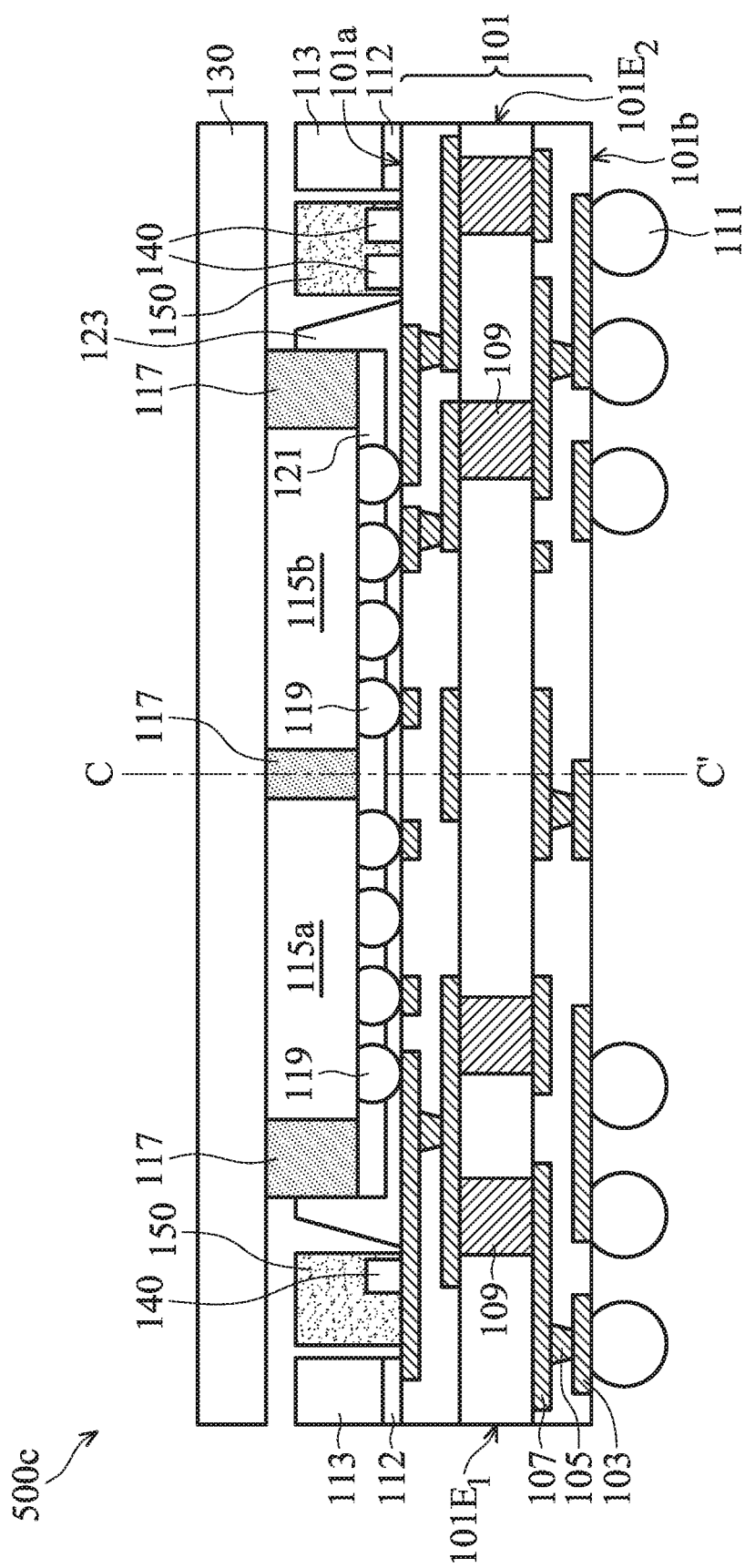
FIG. 8 is a cross-sectional view of a semiconductor package structure, in accordance with some other embodiments of the disclosure.

FIG. 8 is a cross-sectional view of a semiconductor package structure 500c, in accordance with some other embodiments of the disclosure. It should be noted that the semiconductor package structure 500c may include the same or similar portions as that of the semiconductor package structure 500b, and for the sake of simplicity, those portions will not be discussed in detail again. For example, the semiconductor package structure 500c includes a substrate 101, a frame 113, semiconductor dies 115a, 115b, a heat sink 130, and a buffer layer 150. In the present embodiment, the buffer layer 150 is separated from the frame 113 and the semiconductor dies 115a, 115b, reducing the difficulty of forming the buffer layer 150. In addition, there is a gap between the heat sink 130 and the frame 113, the buffer layer 150. As set forth above, the frame 113 and the buffer layer 150 may not interfere the bonging between the semiconductor dies 115a, 115b and the heat sink 130.

Figure 9:
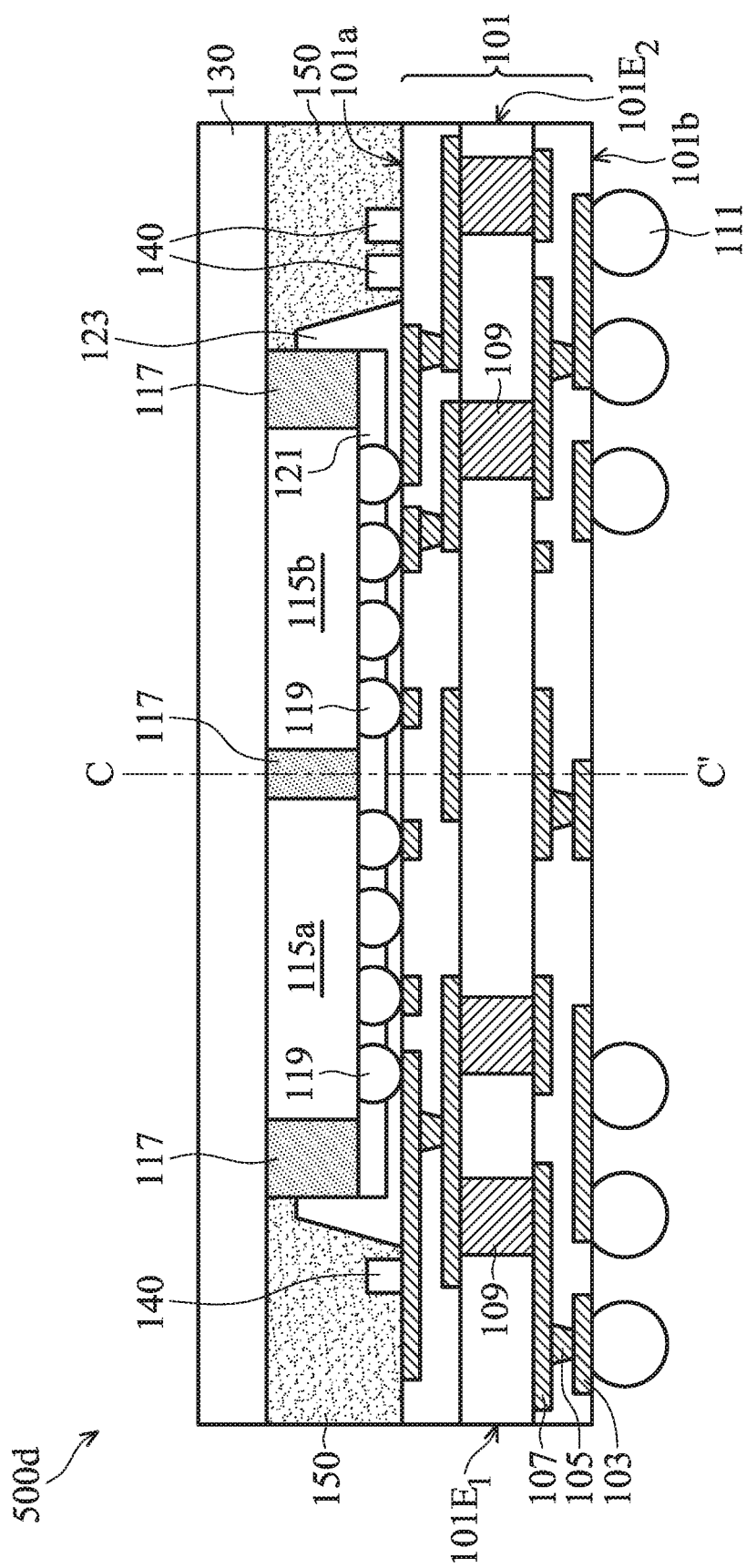
FIG. 9 is a cross-sectional view of a semiconductor package structure, in accordance with some other embodiments of the disclosure.

FIG. 9 is a cross-sectional view of a semiconductor package structure 500d, in accordance with some other embodiments of the disclosure. It should be noted that the semiconductor package structure 500c may include the same or similar portions as that of the semiconductor package structure 500b, and for the sake of simplicity, those portions will not be discussed in detail again. For example, the semiconductor package structure 500c includes a substrate 101, semiconductor dies 115a, 115b, a heat sink 130, and a buffer layer 150. In the present embodiment, the frame 113 is omitted and replaced by the buffer layer 150, such that the manufacturing process of the semiconductor package structure 500d may be simplified, reducing the required time and cost of the manufacturing process. It should be noted that the buffer layer 150 may provide sufficient support so as to reduce the warpage issue of the semiconductor package structure 500d. In the present embodiment, the heat sink 130 is disposed directly above the semiconductor dies 115a, 115b and the buffer layer 150.

Figure 10:
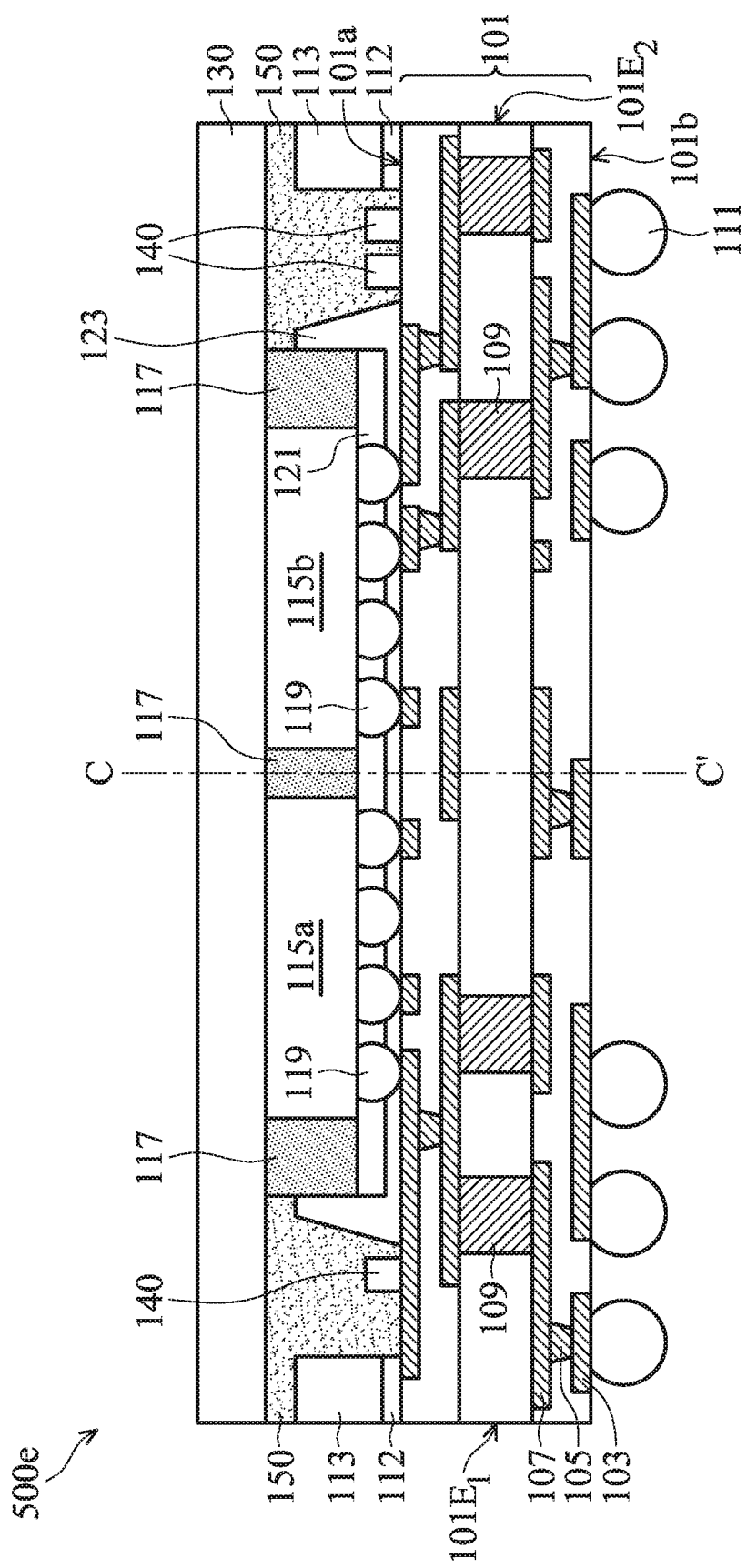
FIG. 10 is a cross-sectional view of a semiconductor package structure, in accordance with some other embodiments of the disclosure.

FIG. 10 is a cross-sectional view of a semiconductor package structure 500e, in accordance with some other embodiments of the disclosure. It should be noted that the semiconductor package structure 500c may include the same or similar portions as that of the semiconductor package structure 500b, and for the sake of simplicity, those portions will not be discussed in detail again. For example, the semiconductor package structure 500c includes a substrate 101, a frame 113, semiconductor dies 115a, 115b, a heat sink 130, and a buffer layer 150. In the present embodiment, the buffer layer 150 covers the upper surface of the frame 113. As a result, the frame 113 may not directly contact the heat sink 130 (namely, the frame 113 may be separated from the heat sink 130), and the buffer layer 150 contacts the heat sink 130 instead. Since the flatness of the surface formed by the buffer layer 150 may be higher than the flatness of the surface formed by the frame 113, a flatter interface between the buffer layer 150 and the heat sink 150. Accordingly, the contact between the semiconductor dies 115a, 115b and the heat sink 150 may be created, enhancing the thermal dissipation of the semiconductor dies 115a, 115b.

According to the foregoing embodiments, the holes formed in the substrate are designed to release the stress in the substrate, especially the stress concentrated in the region below the interface between two semiconductor dies. Since the semiconductor package structure may be highly stressed due to the different coefficients of thermal expansion (CTEs) of the substrate and the semiconductor dies, the holes formed in the substrate can solve the warping or cracking problems caused by mismatched CTEs. As a result, the electrical connection within the semiconductor package structure may not be damaged, and the reliability and the lifespan of the semiconductor package structure may be increased. In addition, in some embodiment of the present disclosure, the buffer layer formed on the substrate may help to reduce warpage of the semiconductor package structure and/or enhance the thermal dissipation of the semiconductor dies.

In the foregoing embodiments, the semiconductor dies 115a and 115b may be formed in the same package, for example, the semiconductor dies 115a and 115b are disposed on a fan-out package interposer, the fan-out package interposer is a rewiring laminate structure. In addition, the semiconductor dies 115a and 115b could be disposed on a Chip-on-Wafer-on-Substrate (CoWoS) structure with a package interposer, the package interposer has multiple through silicon vias (TSVs) as interconnection between the semiconductore dies and the substrate 101.

In other embodiments, the semiconductor dies 115a and 115b may be formed in different packages, for example, the semiconductor die 115a could be a flip-chip (FC) package, while the semiconductor die 115b could be a fan-out structure. The package construction may be varied to achieve different technical purposes.

Many variations and/or modifications can be made to embodiments of the disclosure. The semiconductor package structures in accordance with some embodiments of the disclosure can be used to form a three-dimensional (3D) package, a 2.5D package, a fan-out package, or another suitable package. In addition, the arrangements, the shapes, and the locations of the holes in the substrate can be adjusted according to the types of the application.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
a substrate;
a semiconductor die disposed over the substrate;
a frame disposed over the substrate, wherein the frame is adjacent to the semiconductor die, and an upper surface of the frame is lower than an upper surface of the semiconductor die, wherein the frame has a sidewall away from the semiconductor die; and
a buffer layer disposed over the substrate and located in a space surrounded by the semiconductor die and the frame, wherein the sidewall of the frame is exposed from the buffer layer.

2. The semiconductor package structure as claimed in claim 1, further comprising a buffer layer disposed over the substrate, wherein the buffer layer is located between the frame and the semiconductor die.

3. The semiconductor package structure as claimed in claim 2, wherein the buffer layer is in contact with the frame.

4. The semiconductor package structure as claimed in claim 2, wherein the buffer layer covers the upper surface of the frame.

5. The semiconductor package structure as claimed in claim 2, further comprising a passive component disposed on the substrate, wherein the passive component is surrounded by the buffer layer.

6. The semiconductor package structure as claimed in claim 2, wherein the buffer layer is separated from the frame and the semiconductor die.

7. The semiconductor package structure as claimed in claim 1, further comprising a heat sink disposed over the semiconductor die, wherein as viewed in a direction that is perpendicular to the upper surface of the semiconductor die, the heat sink overlaps with the frame and the semiconductor die.

8. A semiconductor package structure, comprising:
a substrate;
a semiconductor die disposed over the substrate;
a frame disposed over the substrate; and
a buffer layer disposed on the substrate and located in a space surrounded by the semiconductor die and the frame, wherein an upper surface of the frame is substantially level with an upper surface of the buffer layer, and a gap is formed between the buffer layer and a sidewall of the frame.

9. The semiconductor package structure as claimed in claim 8, wherein the buffer layer is separated from the frame and the semiconductor die.

10. The semiconductor package structure as claimed in claim 8, further comprising a passive component disposed on the substrate, wherein the passive component is surrounded by the buffer layer.

11. The semiconductor package structure as claimed in claim 8, further comprising a heat sink disposed over the semiconductor die, wherein the heat sink is in contact with at least one of the semiconductor die, the frame and the buffer layer.

12. A semiconductor package structure, comprising:
a substrate;
a semiconductor die disposed over the substrate;
a buffer layer disposed on the semiconductor die and located adjacent to the semiconductor die, wherein an upper surface of the buffer layer is substantially level with an upper surface of the semiconductor die; and
a frame disposed over the substrate, wherein the frame has a sidewall away from the semiconductor die, the buffer layer is located in a space surrounded by the semiconductor die and the frame, and the sidewall of the frame is exposed from the buffer layer.

13. The semiconductor package structure as claimed in claim 12, wherein the buffer layer is located between the semiconductor die and the frame.

14. The semiconductor package structure as claimed in claim 13, wherein the buffer layer is separated from the frame and the semiconductor die.

15. The semiconductor package structure as claimed in claim 13, wherein the buffer layer covers an upper surface of the frame.

16. The semiconductor package structure as claimed in claim 12, further comprising a passive component disposed on the substrate, wherein the passive component is surrounded by the buffer layer.

17. The semiconductor package structure as claimed in claim 12, further comprising a heat sink disposed over the semiconductor die, wherein the heat sink is disposed directly above at least one of the semiconductor die and the buffer layer.

18. The semiconductor package structure as claimed in claim 17, wherein the heat sink is separated from the frame.

* * * * *